United States Patent [19]

Ono et al.

[11] 4,236,095
[45] Nov. 25, 1980

[54] SURFACE ACOUSTIC WAVE DEVICE COMPRISING PIEZOELECTRIC SUBSTRATE HAVING ZINC OXIDE LAYER ON α-ALUMINA LAYER

[75] Inventors: Shusuke Ono; Tsuneo Mitsuyu; Osamu Yamazaki; Kiyotaka Wasa, all of Kadoma, Japan

[73] Assignee: Matsushita Electric Industrial Company, Limited, Osaka, Japan

[21] Appl. No.: 30,906

[22] Filed: Apr. 17, 1979

[30] Foreign Application Priority Data

Apr. 18, 1978 [JP] Japan .................................. 53-46291

[51] Int. Cl.³ .......................................... H01L 41/18
[52] U.S. Cl. .............................................. 310/313 A
[58] Field of Search ............... 310/313, 360; 333/150, 333/154, 193; 357/26

[56] References Cited

U.S. PATENT DOCUMENTS

| | | | |
|---|---|---|---|
| 3,955,160 | 5/1976 | Duffy | 310/313 |
| 4,038,615 | 7/1977 | Ishiyama et al. | 333/154 X |
| 4,097,900 | 6/1978 | Moulin et al. | 310/313 X |

Primary Examiner—Mark O. Budd
Attorney, Agent, or Firm—Lowe, King, Price & Becker

[57] ABSTRACT

A surface acoustic wave device comprising a piezoelectric substrate which comprises an α-alumina layer as a base region and a zinc oxide layer as a surface region formed on the α-alumina layer. Preferably the two layers are each made of a single crystal, and the thickness of the zinc oxide layer and an angle between a crystallographic axis of the zinc oxide single crystal and the direction of wave propagation are determined so as to fall within optimum ranges, respectively. This device features an increased phase velocity and an augmented value for the electromechanical coupling coefficient and accordingly is of use at very-high to ultra-high frequencies.

3 Claims, 6 Drawing Figures

SURFACE ACOUSTIC WAVE DEVICE COMPRISING PIEZOELECTRIC SUBSTRATE HAVING ZINC OXIDE LAYER ON α-ALUMINA LAYER

BACKGROUND OF THE INVENTION

This invention relates to a surface acoustic wave device of the type utilizing a piezoelectric substrate which comprises a cyrstalline zinc oxide coating layer on a base layer of an electrically insulating material.

As is well known, a surface acoustic wave device is obtained by providing interdigital electrodes onto a piezoelectric substrate. In this device the dimensions of the electrodes are made proportional to the wavelength $\lambda$ of surface acoustic waves to be propagated, and the wavelength is given by the equation $\lambda = v/f$, where $v$ is the velocity of propagation of the waves (phase velocity) and $f$ is the frequency. It becomes necessary, therefore, to extremely diminish the dimensions of the electrodes where the device is to be used at high frequencies such as VHF or UHF bands, and this offers difficulties to the manufacture of the electrodes. From this reason it is desirable to utilize a piezoelectric substrate in which the wave propagation velocity is as high as possible for a surface acoustic wave device for use at high frequencies.

A typical example of conventional piezoelectric substrate for surface acoustic wave devices is a double-layer substrate consisting of a base plate of fused quartz, or a different type of glass, and a surface region or coating layer of crystalline zinc oxide which is a piezoelectric material. However, this piezoelectric substrate is unsatisfactory for use at high frequencies because the phase velocity in this substrate is not so high, and, besides, the effective electromechanical coupling coefficient $K^2$, a primary factor determining the characteristics of a surface acoustic wave device, of a device utilizing this substrate cannot be made sufficiently large. For example, the phase velocity is about 3300 m/s and the coefficient $K^2$ is about 1.0% in the case of a substrate having a fused quartz plate and a zinc oxide layer coated on the glass plate.

SUMMARY OF THE INVENTION

It is an object of the present invention to provide an improved surface acoustic wave device, which features a remarkably increased velocity of propagation of surface acoustic waves and an exceedingly large value for the effective electromechanical coupling coefficient $K^2$ and, accordingly, is of use at high frequencies including VHF and UHF bands.

It is another object of the invention to provide an improved piezoelectric substrate of the type having a zinc oxide coating, which substrate gives a surface acoustic wave device of the above stated improved characteristics.

A surface acoustic wave device according to the invention comprises a piezoelectric substrate which comprises a layer of α-alumina as a base region and a layer of crystalline zinc oxide as a surface region formed on and in intimate contact with one side of the α-alumina layer.

Preferably the base region of this substrate is made of a single crystal of α-alumina oriented such that a (0 1 $\bar{1}$ 2) plane of the single crystal gives the surface on which is formed the zinc oxide layer preferably as a single crystal of zinc oxide. In this case, it is preferable that the <0 0 0 1> axis of the zinc oxide single crystal layer becomes parallel to the <0 $\bar{1}$ 1 1> axis of the α-alumina single crystal layer. Furthermore, it is preferable that the direction of propagation of surface acoustic waves in this device does not greatly deviate from the direction of the <0 0 0 1> axis of the zinc oxide single crystal. Numerically, it is preferable that an angle between the two directions falls within the range from $-35°$ to $+35°$, and more preferably within a narrower range such as from $-15°$ to $+15°$.

There is an optimum value for the thickness of the zinc oxide layer in connection with the wavelength $\lambda$, and it is preferable that the thickness of the zinc oxide layer in terms of kd, where d is actual thickness of this layer and k is wave number defined by $2\pi/\lambda$, falls within the range from 0.84 to 5.01, and more preferably within a narrower range such as from 1.40 to 2.88.

DESCRIPTION OF THE PREFERRED EMBODIMENTS

Figure 1:
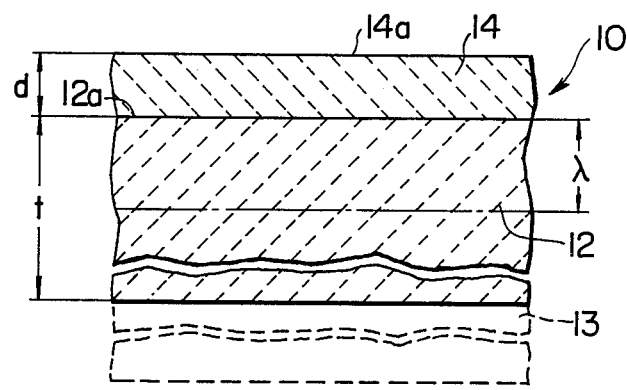
FIG. 1 is a fragmentarily enlarged sectional view of a substrate having a piezoelectric coating, a principal part of a surface acoustic wave device according to the invention.

FIG. 1 shows a fundamental structure of a piezoelectric substrate 10 according to the invention. A surface acoustic wave device according to the invention is obtained by providing electrodes (not illustrated) of a known design onto a top surface 14a of this substrate 10. In principle, this substrate 10 has a double-layer structure consisting of a base region 12 of α-alumina and a surface region 14 of piezoelectric zinc oxide. The surface region 14 is a thin layer formed by coating one surface 12a of an α-Al$_2$O$_3$ plate (12) with crystalline ZnO. From a principal or functional viewpoint, the thickness $\tau$ of the α-alumina layer 12 is required only to be larger than the wavelength $\lambda$ of surface acoustic waves to be propagated in a device utilizing this substrate 10 because vibration components of the surface acoustic waves are concentrated in a surface region of a thickness corresponding to the wavelength $\lambda$. In practice, however, the α-alumina layer 12 is usually made thick enough to serve as a structurally basic part of the substrate 10. Alternatively, the substrate 10 may comprise an additional layer 13 of an optional material (different from α-Al$_2$O$_3$) on the back side of the α-alumina layer 12.

It is permissible that the α-alumina of the base layer 12 is polycrystalline, but it is highly preferable that the base layer 12 is of a single crystal of α-Al$_2$O$_3$, that is, the layer 12 is of sapphire. By using a single crystal of α-Al$_2$O$_3$, it becomes possible to form very minute electrodes on the surface 14a of the substrate 10 because of the possibility of producing the substrate 10 with extreme smoothness of the surface 14a, and, besides, propagation loss of the surface acoustic waves becomes very small. More particularly, it is preferable that the sapphire layer 12 is oriented such that a (0 1 $\bar{1}$ 2) plane, i.e. so-called "R plane", of the single crystal gives the top surface 12a of the base layer 12 because then the piezoelectric layer 14 can be formed as a single crystal of zinc oxide with its (1 1 $\bar{2}$ 0) plane as the surface 14a of this layer 14, i.e. surface of the substrate 10 and, therefore, brings about the aforementioned merits. In this case, it is the most preferable to design a surface acoustic wave device such that the directon of propagation of the surface acoustic waves does not greatly deviate from the direction of the $<0\ 0\ 0\ 1>$ axis of the zinc oxide single crystal because of the possibility of realizing a remarkably large value for an effective electromechanical coupling coefficient and, hence, the most desirable characteristics of the device as will be described later more in detail.

The zinc oxide film 14 can be formed on the surface 12a of an α-alumina plate (12) by a known thin-film-forming technique such as activated vacuum evaporation, sputtering or chemical vapor phase deposition. In the case of forming a zinc oxide single crystal film on a sapphire plate, attention should be given to the film-forming conditions such as the temperature of the sapphire plate and the rate of crystal growth. In a sputtering method by way of example, the zinc oxide film 14 can be formed with excellent quality by the employment of a growth rate of 1000 A/h on the surface of a sapphire plate maintained at 500° C.

Among the characteristics of a surface acoustic wave device, the most important ones are an effective electromechanical coupling coefficient $K^2$ and the velocity of wave propagation or sound velocity $v$.

Figure 2:
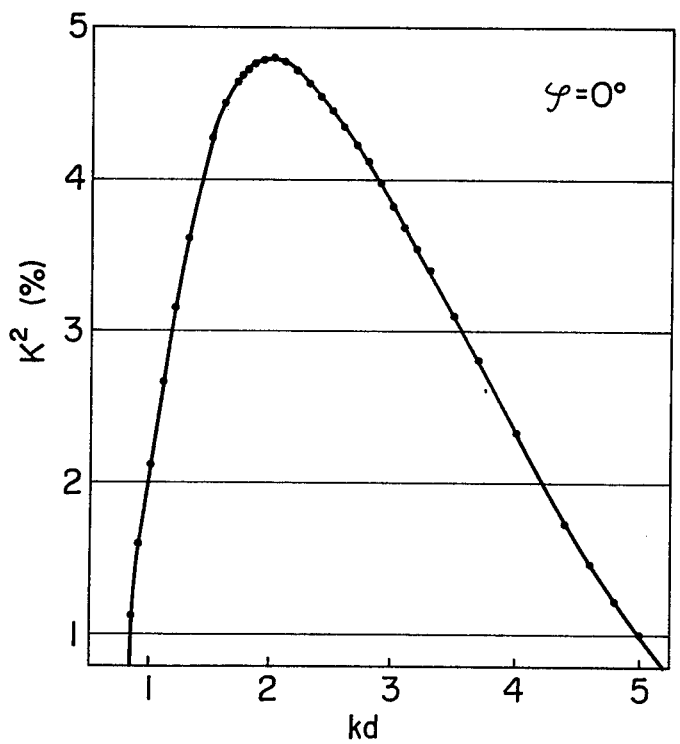
FIGS. 2 and 3 are graphs showing variations in the fundamental characteristics of a surface acoustic wave device utilizing the piezoelectric substrate of FIG. 1 with respect to the thickness of the piezoelectric coating of the substrate.

For a surface acoustic wave device according to the invention produced by forming interdigital electrodes on the substrate 10 of which base region 12 is of sapphire oriented in the most preferable way, the graph of FIG. 2 shows an experimentally confirmed relationship between the thickness of the zinc oxide coating layer 14 and the coefficient $K^2$ when the direction of propagation of surface acoustic waves was made to coincide with the direction of either the $<0\ 0\ 0\ 1>$ axis or $<0\ 0\ 0\ \bar{1}>$ axis of the zinc oxide single crystal 14. On the abscissa, the thickness of the zinc oxide coating layer 14 is given in terms of $kd=2\pi d/\lambda$, where d is actual thickness of this layer 14 and $k(=2\pi/\lambda)$ is wave number of the surface acoustic waves, and $\lambda$ is the wavelength. For the same device, the graph of FIG. 3 shows an experimentally confirmed relationship between the zinc oxide layer thickness kd and the velocity of propagation of the surface acoustic waves, i.e. sound velodity $v$ in the device.

Figure 3:
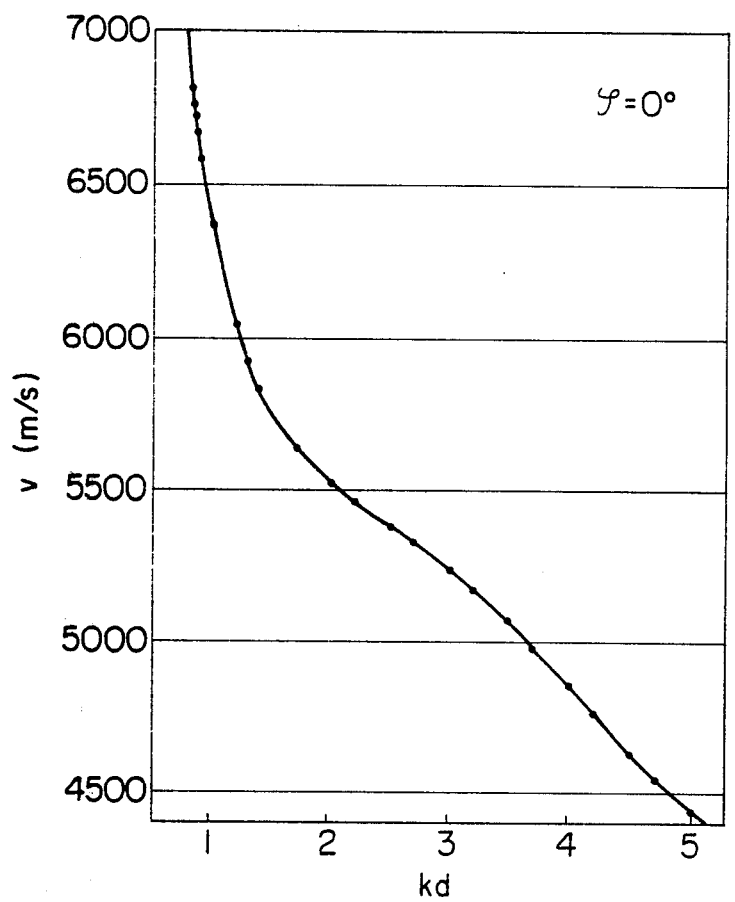

The curves of FIGS. 2 and 3 teach that the effective electromechanical coupling coefficient $K^2$ of the device is within the range from 1% to 4.8% and the sound velocity $v$ is within the range from 4450 m/s to 7000 m/s while the zinc oxide coating layer 14 has such a thickness d that $0.84 \leq kd \leq 5.01$. In other words, these experimental results demonstrate that, in a surface acoustic wave device according to the invention with such a thickness d of the ZnO layer 14, the sound velocity becomes at least about 35% higher than the sound velocity in a conventional device having a ZnO coating on a base plate of fused quartz, while the coefficient $K^2$ in the device of the invention is comparable with or larger than that in the conventional device.

The curves of FIGS. 2 and 3 teach further that the coefficient $K^2$ in a surface acoustic wave device according to the invention can be made more than twice as large as the maximum $K^2$ value in the conventional device together with more than about 45% increase in the sound velocity $v$ by making the thickness of the ZnO coating 14 fall within a narrower range expressed by $0.96 \leq kd \leq 4.21$.

Moreover, $K^2$ can be made more than four times as large as the conventional $K^2$ value together with more than about 60% increase in the sound velocity $v$ by making the thickness of the coating 14 fall within a more narrower range expressed by $1.40 \leq kd \leq 2.88$.

Furthermore, $K^2$ can be made more than 4.6 times as large as the conventional $K^2$ value together with more than about 64% increase in the sound velocity $v$ by more strictly limiting the thickness of the coating 14 such that $1.66 \leq kd \leq 2.35$.

In particular, the employment of an optimum thickness of the ZnO coating 14, that is, $kd=2.00$, gives an extremely superior surface acoustic wave device in which $K^2$ is about 4.8 times as large as the conventional $K^2$ value and the sound velocity $v$ is about 67% higher than the conventional sound velocity value.

As mentioned above, the improved values for the coefficient $K^2$ and the sound velocity $v$ shown in FIGS. 2 and 3 were obtained when the direction of wave propagation coincided with the direction of either the $<0\ 0\ 0\ 1>$ axis or $<0\ 0\ 0\ \bar{1}>$ axis of the ZnO single crystal that constituted the piezoelectric layer 14. Where the direction of the wave propagation deviates from the direction of the $<0\ 0\ 0\ 1>$ axis or $<0\ 0\ 0\ \bar{1}>$ axis, changes occur both in the $K^2$ value and in the sound velocity $v$ for every thickness value kd. The details of such changes will be described with reference to FIGS. 4-6.

Figure 4:
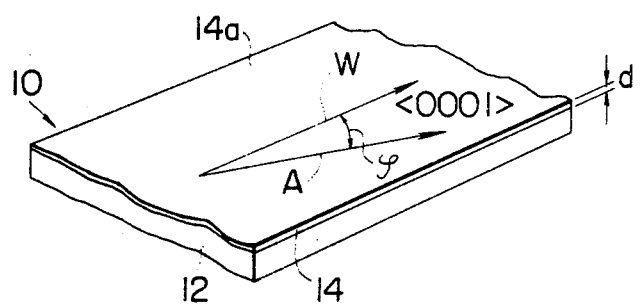
FIG. 4 is a fragmentary and perspective view of the substrate of FIG. 1 for the explanation of an angle between the direction of surface acoustic wave propagation and a crystallographic axis in the piezoelectric coating.

FIG. 4 shows the substrate 10 of FIG. 1 in a fragmentary and perspective view, assuming that the α-Al$_2$O$_3$ layer 12 and the ZnO layer 14 are each of a single crystal. The arrow W indicates the direction of propagation of surface acoustic waves on the surface 14a of a surface acoustic wave device utilizing this substrate 10, and the arrow A indicates the direction of the $<0\ 0\ 0\ 1>$ axis (or $<0\ 0\ 0\ \bar{1}>$ axis) of the ZnO single crystal 14. An experiment was carried out to examine the influence of an angle $\psi$ between the two directions W and A on the values for the effective electromechanical coupling coefficient $K^2$ and the sound velocity $v$ on samples in which the thickness d of the ZnO coating layer 14 was determined such that $kd=2.0$. The curve of FIG. 5 represents the dependence of the coefficient $K^2$ on the angle $\psi$ observed in this experiment, and the curve of FIG. 6 shows the experimentally confirmed dependence of the sound velocity $v$ on the angle $\psi$.

Figure 5:
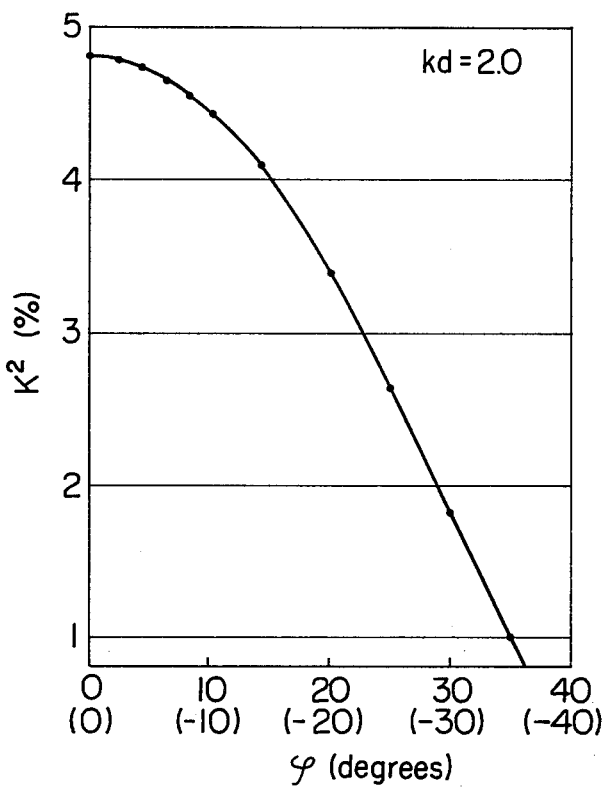
FIGS. 5 and 6 are graphs showing variations in the fundamental characteristics of the aforementioned device with respect to the angle shown in FIG. 4.
Figure 6:
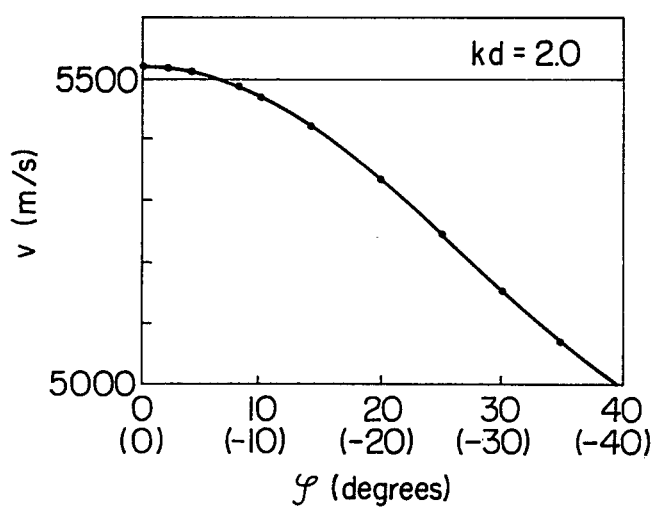

The curves of FIGS. 5 and 6 demonstrate that, in a surface acoustic device according to the invention in which the piezoelectric layer 14 of ZnO single crystal has an optimum thickness, the sound velocity $v$ can be made at least about 54% higher than the sound velocity in the aforementioned conventional device (utilizing a base plate of fused quartz), while the coefficient $K^2$ in the device according to the invention is comparable to or larger than the conventional $K^2$ value, by determining the direction W of wave propagation such that the angle $\psi$ falls within the range from −35° to +35°, that is, $-35° \leq \psi \leq +35°$.

These curves teach further that the coefficient $K^2$ in the device according to the invention can be made more than twice as large as the $K^2$ value in the conventional device together with more than about 57% increase in the sound velocity $v$ by making the angle $\psi$ fall within the range from $-29°$ to $+29°$.

Moreover, $K^2$ can be made more than four times as large as the conventional $K^2$ value together with more than about 64% increase in the sound velocity $v$ by designing such that the angle $\psi$ is in the range from $-15°$ to $+15°$.

Furthermore, $K^2$ can be made more than 4.6 times as large as the conventional $K^2$ value together with more than about 67% increase in the sound velocity $v$ by designing such that the angle $\psi$ is in the range from $-7°$ to $+7°$.

In particular, by designing such that $\psi=0°$, meaning that the direction W of wave propagation coincides with the direction A of the $<0\ 0\ 0\ 1>$ axis (or $<0\ 0\ 0\ \bar{1}>$ axis) of the ZnO single crystal 14, a surface acoustic wave device having a maximized value (4.8%) for the coefficient $K^2$ can be obtained as mentioned hereinbefore with reference to FIGS. 2 and 3.

As will be understood from the foregoing description, a piezoelectric substrate according to the invention gives a surprisingly improved surface acoustic wave device which is larger in electromechanical coupling coefficient and higher in the sound velocity than conventional surface acoustic wave devices utilizing a substrate having a piezoelectric zinc oxide coating layer. A surface acoustic wave device according to the invention exhibits excellent characteristics at high frequencies including VHF and UHF bands because of the augmentation of both the electromechanical coupling coefficient and sound velocity and, therefore, is of use in a wide variety of fields.

What is claimed is:

1. A surface acoustic wave device comprising a piezoelectric substrate which comprises a layer of $\alpha$-alumina as a base region and a layer of crystalline zinc oxide as a surface region formed on and in intimate contact with one side of said $\alpha$-alumina layer, wherein said $\alpha$-alumina layer has a thickness greater than the wavelength of a surface acoustic wave to be propagated in the device, and wherein said $\alpha$-alumina layer is made of a single crystal of $\alpha$-alumina having a $(00\bar{1}2)$ plane, said single crystal being oriented such that the zinc oxide layer is formed on said $(01\bar{1}2)$ plane, and wherein said zinc oxide layer is made of a single crystal of zinc oxide such that a $(01\bar{2}0)$ plane of the zinc oxide single crystal gives the outer surface of said surface region of said substrate, the $<0001>$ axis of said zinc oxide single crystal being parallel to the $<0\bar{1}11>$ axis of said $\alpha$-alumina single crystal, the thickness of said zinc oxide layer being in the range of from $0.84/k$ to $5.01/k$, where k is wave number defined by $2\pi/\lambda$ where $\lambda$ is said wavelength.

2. A surface acoustic wave device according to claim 1 wherein an angle between the direction of said $<0001>$ axis of said zinc oxide single crystal and the direction of propagation of said surface acoustic wave is in the range from $-35°$ to $+35°$.

3. A piezoelectric substrate for a surface acoustic wave device, the substrate comprising a layer of $\alpha$-alumina as a base region and a layer of crystalline zinc oxide as a surface region formed on and in intimate contact with one side of said $\alpha$-alumina layer, wherein said $\alpha$-alumina layer is made of a single crystal of $\alpha$-alumino, and said layer of zinc oxide is a single crystal of zinc oxide, said single crystal of $\alpha$-alumina being oriented such that a $(00\bar{1}2)$ plane of the $\alpha$-alumina single crystal gives the outer surface of said base region, said single crystal of zinc oxide being oriented such that a $(11\bar{2}0)$ plane of the zinc oxide single crystal gives the outer surface of said surface region, the $<0001>$ axis of said single crystal of zinc oxide being parallel to the $<0\bar{1}11>$ axis of said $\alpha$-alumina single crystal, the thickness of said zinc oxide layer being in the range of $0.84/k$ to $5.01/k$, where k is wave number defined by $2\pi/\lambda$ where $\lambda$ is said wavelength.

* * * * *